(12) United States Patent
Sacchetti

(10) Patent No.: US 8,736,449 B2
(45) Date of Patent: May 27, 2014

(54) ANTITHEFT SYSTEM FOR PHOTOVOLTAIC PANELS

(76) Inventor: Antonio Sacchetti, Conversano (IT)

( * ) Notice: Subject to any disclaimer, the term of this patent is extended or adjusted under 35 U.S.C. 154(b) by 44 days.

(21) Appl. No.: 13/515,599

(22) PCT Filed: Dec. 14, 2010

(86) PCT No.: PCT/IT2010/000501
§ 371 (c)(1),
(2), (4) Date: Jun. 13, 2012

(87) PCT Pub. No.: WO2011/074025
PCT Pub. Date: Jun. 23, 2011

(65) Prior Publication Data
US 2012/0249329 A1 Oct. 4, 2012

(30) Foreign Application Priority Data
Dec. 14, 2009 (IT) .............................. BA2009A0053

(51) Int. Cl.
*G08B 13/14* (2006.01)
*H02J 7/04* (2006.01)

(52) U.S. Cl.
CPC ...................................... *H02J 7/04* (2013.01)
USPC ..................... 340/568.1; 340/660; 340/572.1; 340/572.4; 340/5.2; 340/5.3; 235/384; 235/385; 235/435; 235/444

(58) Field of Classification Search
USPC .......... 340/568.1, 660, 572.1, 572.4, 5.2, 5.3; 235/384, 385, 435, 444
See application file for complete search history.

(56) References Cited

U.S. PATENT DOCUMENTS

| 6,191,501 | B1 | 2/2001 | Bos |
| 6,650,031 | B1 | 11/2003 | Goldack |
| 2005/0224109 | A1 | 10/2005 | Posbic et al. |
| 2008/0147335 | A1 | 6/2008 | Adest et al. |
| 2010/0295680 | A1* | 11/2010 | Dumps ...................... 340/568.1 |
| 2011/0037600 | A1* | 2/2011 | Takehara et al. .............. 340/635 |

FOREIGN PATENT DOCUMENTS

| DE | 39 08 000 A1 | 9/1990 |
| DE | 20 2007 011 806 U1 | 10/2007 |
| EP | 1 587 148 A1 | 10/2005 |
| EP | 1 868 248 A1 | 12/2007 |
| EP | 2 061 088 A2 | 5/2009 |
| WO | 2004/090993 A2 | 10/2004 |
| WO | 2007/006564 A2 | 1/2007 |
| WO | 2007/144036 A1 | 12/2007 |
| WO | 2008/046370 A1 | 4/2008 |
| WO | 2009/056957 A2 | 5/2009 |
| WO | 2009/098729 A1 | 8/2009 |

OTHER PUBLICATIONS

International Search Report, dated May 2, 2011, from corresponding PCT application.

* cited by examiner

*Primary Examiner* — Tai T Nguyen
(74) *Attorney, Agent, or Firm* — Young & Thompson

(57) ABSTRACT

An anti-effraction and antitheft system (1) of an electromechanical type for photovoltaic panels (8) and components of electrical plants and systems in general, which has the purpose of rendering unserviceable and/or unlikely to be reusable, in the case of theft or tampering, of the photovoltaic panels (8). The system (1) is based upon the combination of functions of connection and electrical and electronic functions; namely, it is based upon at least one electromechanical element or connector (24), an electronic unit or management card (21) and a central system (39) with georeferencing, communication, and signalling functions.

9 Claims, 5 Drawing Sheets

ANTITHEFT SYSTEM FOR PHOTOVOLTAIC PANELS

Figure 1:
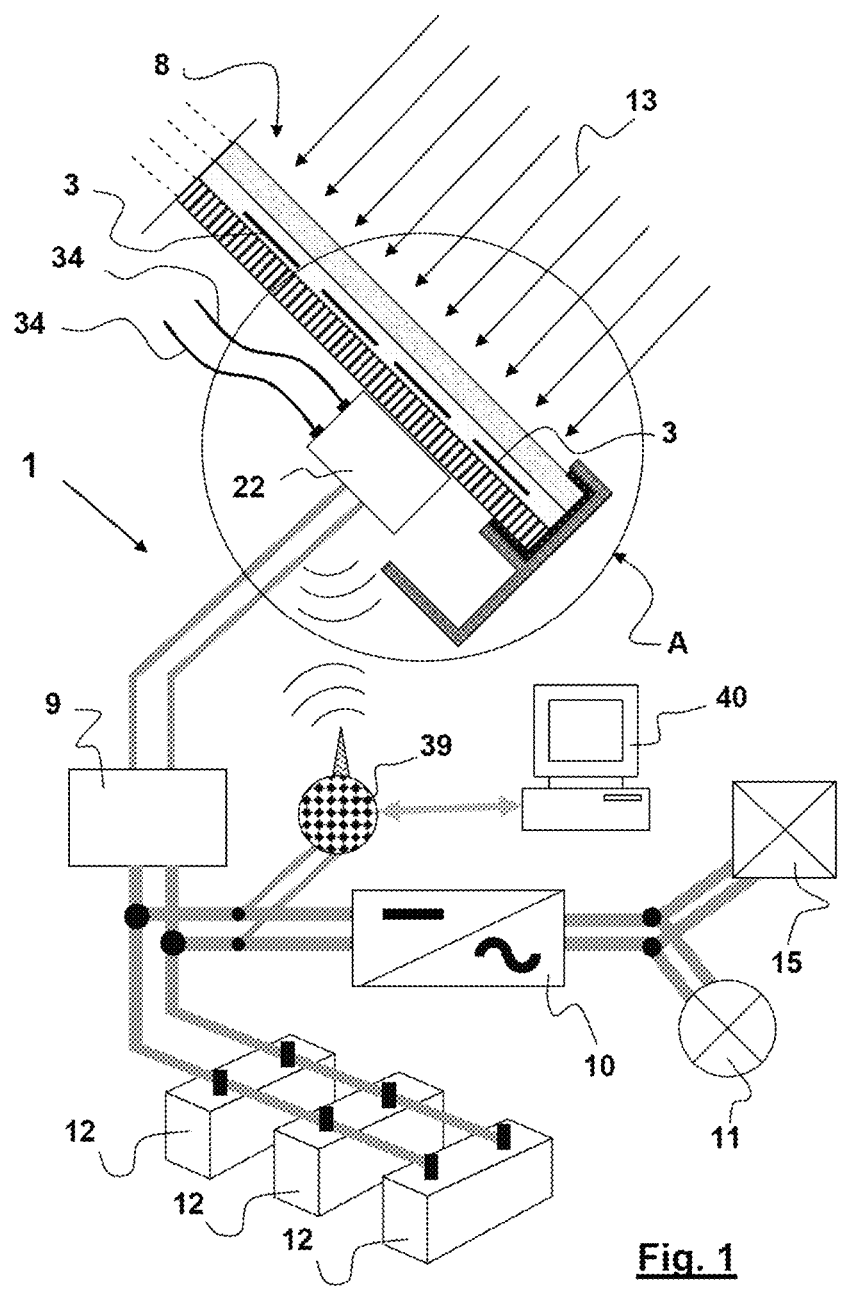

The present invention concerns an innovative anti-effraction and antitheft system of an electromechanical type for photovoltaic panels and components of electrical systems and plants in general.

The present system is completely new in so far as there currently do not exist similar products in the known art.

The system is inventive in so far as it is devised and designed in order to render unserviceable and/or unlikely to be re-usable, in the case of theft or tampering, the individual components of the photovoltaic modules and the devices associated to them, which constitute the photovoltaic system or plant, in so far as the anti-effraction and antitheft system devised is characterized in that every possible mode of theft that were to be carried out on each component, device, or part of the photovoltaic system, including the panels, determines a variation of the use of said elements in such a way that they will no longer be re-usable in their full functionality and/or in such a way that they will present an indelible trace of the effraction event.

The present system is fundamentally based upon a set of elements and devices constrained together with appropriate arrangements in such a way as to bestow, on account of their synergistic position, a valid protection of a deterrent type against theft and effraction, and on account of its characteristics the present system can be defined as an antitheft and anti-effraction system of a passive type. The deterrent effects of passive protection of the system, which are deemed of primary importance, can then be combined to further elements and devices that actuate alarms, which are deemed of secondary importance in so far as they require prompt human intervention.

In the known art, a photovoltaic module or panel is typically constituted by a series of photovoltaic cells that are connected in series together by conductive wires-strips and contained flat, by means of a process of lamination, within a layer of material, of an EVA (ethylene vinyl acetate) polyethylene type or the like. With the wording "EVA polyethylene" or hereinafter simply "EVA" reference is made to a family of products that have in common the fact of being principally made up of cross-linked and foamed polyolefin resins (foamed polyethylene). These are closed-cell foams, which, owing to their characteristics, find application in all sectors. In particular, they present an excellent behaviour in regard to mechanical stresses, excellent buoyancy, good thermal insulation, and, in particular combinations, also good acoustic insulation. The excellent workability enables their use in applications obtained by moulding, lamination, slitting, dinking, flocking, etc. It is possible to couple them to different materials to improve the characteristics thereof, for example to an aluminium film or a lead plate or else to protective films in order to improve the resistance to heat, the acoustic characteristics, or the resistance to abrasion. It is likewise possible to treat a surface with various types of adhesives (protected by removable film) in order to facilitate laying thereof on the installation site, said treatment guaranteeing complete insulation from the outside world. In the case of photovoltaic panels, on the front part, where the light radiation impinges, this layer of EVA is then coated with a layer of transparent material of a glass type or the like, whereas on the rear part the conductive wires for conduction of the electricity produced by the panels exit. The wires are at least two but may be more if the arrays of cells is broken down into sub-arrays. There may be various layers of material, for other purposes, which in any case are provided with openings/holes to enable passage of the conductive wires; the last of these layers is of a glass or plastic type, for example Tedlar®. Tedlar® is a film of polyvinyl fluoride characterized by excellent chemical and electrical properties, as well as excellent properties of mechanical strength; added to these are interesting characteristics of barrier to UV rays and of resistance to atmospheric ageing. Tedlar® film is consequently particularly indicated in all those situations that require protection from dirt and chemical attack. Tedlar® possesses excellent properties of anti-adherence that render it particularly suitable as detaching agent in the production of laminates for printed circuits. The surfaces of the film can in any case be treated and made to adhere with appropriate adhesives and/or glues on different surfaces (protection of photovoltaic panels, panels for the building industry, fabrics for tensostructures, etc.). Everything is held together by a frame of usually metal material, which in some cases is omitted and replaced only by sealant material. The connection of the panel to the rest of the photovoltaic system is made through a junction box, which is fixed to the rear layer of the panel and contains internal connectors to which are to be connected the conductive wires and the cable glands, from which two sheathed conductors exit, which are in turn connected internally to the conductive wires coming directly from the cells. The two sheathed conductors exiting from each photovoltaic panel conduct the current between different panels in series, which ate connected to form a string, and then converge to the input of the photovoltaic inverters.

Currently there exist different systems and devices that are used as anti-effraction means for photovoltaic modules and panels.

Amongst all the known patents, we, shall only mention the ones deemed most important for the purposes of the description of the present invention:

- the U.S. Pat. No. 6,650,031, filed in the name of the U.S. company SIEMENS AND SHELL SOLAR GMBH, which regards a system for protection of a photovoltaic module against theft or non-authorized use by an authorized consumer; said system comprises a device inside the photovoltaic module and a device outside the module on the user side, which, by exchanging signals on the power line, bring about interruption of the flow when the communication is interrupted for a given time;
- the U.S. Pat. No. 6,191,501, filed in the name of the U.S. company MERLIN GERIN, which regards the modalities of use of mechanisms of advanced payment for the supply of alternative energy and of the related control systems, with reference, by way of example, to a system for provision of energy of the photovoltaic type and a mechanism of advanced payment suited for control of the supply of usable energy (electrical energy), up to a point of use in conformance with predetermined criteria; the photovoltaic system or plant incorporates in an integrated way a "controller" energy source, which is able to set itself in communication with another corresponding "controller", which integrates the mechanism of advanced payment and hence can even bring about interruption of the flow of power;
- the patent No. WO 2007144036, which regards an antitheft protection unit for each photovoltaic unit, where the photovoltaic unit comprises at least one photovoltaic module fixed on a support; the antitheft protection unit in accordance with the invention is protected by RFID technology; for this purpose, the photovoltaic module comprises a transponder, and the antitheft protection unit comprises a transceiver device for exchange of data with the transponder; the transponders and the transceiver units are hidden by the respectively assigned photovoltaic modules and are inaccessible as long as the solar module is fixed on the support in order to protect the individual unit against tampering;

the patent No. WO2004090993, which regards a photovoltaic panel equipped with means for optimizing the production of electrical energy, via a converter, a means for tracking the Sun, and a system for antitheft detection—which is directly connected to the system for interruption of the electrical energy produced by the panel—by means of an electronic processor;

the patent No. US2005224109, which regards a photovoltaic module made up of a first substrate, a supporting sheet, a solar cell or a plurality of solar cells, each solar cell being positioned between the substrate and the supporting sheet, with at least one thin conductive edge positioned between the substrate and the supporting sheet, which is additionally provided with an electronic device, preferably positioned on said conductive edge, in order to provide the function of detection of a signal or other desired functions connected to the variations of capacitance;

the patent No. EP 1587148, which regards an antitheft system, which connects, during assemblage of the photovoltaic cells, a pair of power terminals at output, and is further provided with a system equipped with a switch in order to interrupt the power available at output to the terminals; the system is permanently supplied via a battery so that it will be always operative even in the event of tampering;

the patent No. WO2007006564, which regards an antitheft system that is based upon the analysis of variables, such as the current or the voltage of the panels at night and upon generation of alarms via radio communications by each panel to a central alarm system.

The disadvantages of the known art regarding the patents mentioned can be summed up in the following points.

As regards all the aforesaid patent applications, they present the disadvantage of performing the antitheft function via functions that do not consider the system as a whole and hence do not adopt a plurality of intimately integrated solutions to solve exhaustively the problem of the attempts at theft and/or effraction in any point of the photovoltaic system. Hence, the inventions according to the patents mentioned do not perform the antitheft function in an exhaustive way and do not even leave indelible traces or render parts or elements of the system partially or totally unusable, as occurs with the present system, which, instead, provides simultaneously a triple protection of a passive type that covers the different possible modes of intervention of the theft, according to whether the attempt at theft occurs with the modality of detachment of the panel from the junction box or even with the modality of detachment of the output cables from the junction box, aimed at removing from the photovoltaic field both the panel and the junction box, or finally with the modality of total removal of the plant or system.

None of the preceding patents manages to offer three distinct forms of protection that are so integrated and omnicomprehensive in regard to the various, possibilities of theft.

Since the antitheft systems and devices for photovoltaic panels referred to in the patents previously mentioned, which form part of the known art, use individual methods of protection, they are unable to afford the integrated function necessary for protecting them, and anyway present the following disadvantages:

as regards the patents Nos. U.S. Pat. Nos. 6,650,031, 6,191,501, WO2007144036, WO2004090993, US2005224109, EP1587148, WO2007006564, WO2008046370, after the theft there is no detectable indelible trace left on the panel that will indicate, following upon a subsequent inspection, that the panel in question is stolen, and hence, after the theft, the panel itself can be re-used without any problem;

as regards the patents Nos. U.S. Pat. No. 6,650,031, WO2007144036, EP1587148, since the use of the communication system between the internal panel and the external panel, or the use of electronic switches inside the panel for blocking, in the absence of said communication or of other criteria, operation of the system is based only upon the insertion of an element within the panel, it poses additional costs and complications to the manufacturers of panels themselves, who must insert, in a high-temperature process, electronic elements to be connected appropriately, which (to mention an even more serious disadvantage), in the case of failure, could bring about complete inoperation or difficulty in re-use of the panel itself, whereas it would be simpler to insert an integrated connector, which is of a modular type and can be inserted "cold", into the last layer of the panel, as the system according to the present invention envisages;

as regards the patents Nos. U.S. Pat. No. 6,650,031, WO 2007144036, the fact that they are based only on the wired support in the communication to a central control unit, for blocking, in the absence of said communication, operation of the system, is limiting since, if the communication cables are distinct from the power cables, this entails further costs and complications of installation, whereas, if the communication cables coincide with those that carry the electric current, there are limitations in the freedom of arranging the cables themselves physically and geometrically, with the further disadvantage that the undesirable modulation of the current itself, as a result of the communication, could cause problems on the stability of the maximum-power-point-tracker (MPPT) functions;

as regards the patents Nos. U.S. Pat. No. 6,191,501, WO2007006564, WO2008046370, the radio communication is not comprised in a system architecture that is able to provide a function of deterrence against theft, but is a simple communication for generating an alarm, which reduces the utility of said function in so far as it is affected by the common problems of non-specialistic antitheft devices of the photovoltaic sector, the foremost problem being the need for prompt human intervention;

as regards the patent No. WO2004090993, the antitheft system is here external to the panel and has no specific integration with the elements of connection thereof, whilst the system for interruption of the flow of energy is itself external to the electronic conversion/antitheft device;

as regards the patent No. US2005224109, the enormous detail of geometrical arrangements for positioning of electronic cards, or even simply of memories, or RFIDs and other electronic elements within the panel does not provide specific solutions to the problem of preventing theft, whilst its functionality and modalities of use do not guarantee a valid function of deterrence against theft, as neither does the generation of alarms that are promptly efficient and effective.

Finally, the patent No. WO2009056957 describes an antitheft device and control system for solar panels in which the antitheft function is obtained substantially through the combination of at least one electronic device that is integrated with the solar panel and is able to communicate with a remote management centre and is equipped with at least one switch that is able to interrupt the supply of energy produced by the solar panel.

From the foregoing it is clear that in the document No. 009056957 the antitheft function is performed by interrupting the supply of energy when the panel is removed from the central system.

The document No. 009056957 envisages the use of a management card fixed to each panel and a central system communicating with the management cards.

One of the main disadvantages of said known technical solution lies in the fact that only one protection against removal of the panel from the central system is envisaged, but there is no protection against removal of the entire system. Furthermore, as regards the system of mechanical fixing of the management card to the panel, it should be noted that the document No. 009056957 simply describes the use of a layer of adhesive or composite resin. The use of said technical solution is inadvisable because maintenance of the electronic parts envisages interventions that are differentiated with respect to those necessary for maintenance of photovoltaic panels.

The purpose of the present invention is, hence, to overcome said disadvantages present in the known art by providing an antitheft system for photovoltaic panels that will be universally valid against effraction.

Said purpose is achieved by providing an antitheft and anti-effraction system 1 for photovoltaic panels 8 and electrical plants or systems in general, intended also for use against the attempts at effraction and tampering, comprising:

- at least one electromechanical means or connector 24, which is designed to be inserted via an irreversible coupling system 27, 28 in at least one rear layer 4 of the photovoltaic panel 8 and connects both mechanically and electrically the panel itself 8 to a junction box or 22 with electrical cables 14 and connectors 20, said connection also becoming irreversible via a purposely provided coupling means 32;
- an electronic unit or printed-board assembly (PBA) or card 21 for management of the panel 8, which can be inserted into the junction box 22 and fixed with respect thereto, and, via said pair of electromechanical means 24, is rendered fixed with respect to the panel 8 and designed to interrupt the flow of current of the panel itself 8 through electronic devices of a MOSFET type or the like, according to bidirectional communication logics, that are possible via a radiofrequency or wired medium connected to a central system 39;
- a central system 39, which communicates with the individual electronic units 21 for management of the panels 8 and is equipped with georeferencing means that use standard systems, such as the Global Positioning System (GPS) or the like, and means for bidirectional communication that use standard, wired or radiofrequency, means that are available on the market, said central system 39 being connected to a PC 40 equipped with software dedicated to said communication and management functions, said PC 40 being in turn connected to the Internet via technically known means;
- each electromechanical anti-effraction means 24, which may be inserted into the panel in the final steps of its production process after prior provision of the rear protective layer 4, can be coupled, in a way that is irreversible and unremovable except by effraction (which in any case would mean that permanent traces are left behind), both to the rear protective layer 4, of a Tedlar® type or the like, set on the back of the photovoltaic panel 8, and to the junction box 22, in such a way that any possible attempt at forced separation of said junction box 22, in addition to entailing an electrical discontinuity of the conductor 14 for electrical connection of the PBA 21 to the photovoltaic cell 3 of the panel 8, preferentially in an area corresponding to its reduced section 16, involves irremediable breakage of at least one of the coupling means or grips 27, 28, 32 for constraining said electromechanical means 24 to the junction box 22 and to the panel 8, the latter, thus constrained, providing, together with the other component parts, a valid anti-effraction and antitheft system 1 of a passive type, rendering inconvenient and/or useless, if not altogether impossible, theft thereof or tampering therewith that entails separation of the panel 8 from the rest of the system, given that there would in any case remain an indelible trace that would prevent re-use of said panel 8.

Another characterizing feature of said anti-effraction and antitheft system 1 for photovoltaic panels 8, thus constituted, is the fact that said electronic card 21, supplied by the panel 8 or battery self-supplied, renders the energy supplied by the panel itself 8 unusable right from the moment in which the junction box 22, with respect to which the panel is fixed, changes its position with respect to the central system 39, in the case of removal due to theft, or else no longer communicates with the management card 21, in the case of effraction, since the system 1 is uniquely integrated in the plant or system so that the photovoltaic panels 8 present communicate periodically with the junction box 22, or with the management cards 21, exclusively as far as a pre-set distance with respect to the central system 39, said distance being very limited, given the low level of the communication signal that is purposely attributed both to the unit 39 and to the unit 21.

A further, but no less important, characterizing feature is inherent in the fact that as soon as the central system 39, supplied from the electric-power mains or self-supplied, is removed, i.e., moved away beyond a pre-set distance, from the site of installation of the photovoltaic plant or system constituted by the panels 8, to which the system 39 itself is uniquely associated thanks to its own georeferencing, it would automatically cause sending of an alarm signal to the management cards 21 and in any case, after a pre-set time interval of absence of communication with said management cards, would cause interruption of communication with the cards themselves, thus entering the functional condition of failure of operation of the panels 8, the latter constituting and element of deterrence against theft and tampering.

Figure 2:
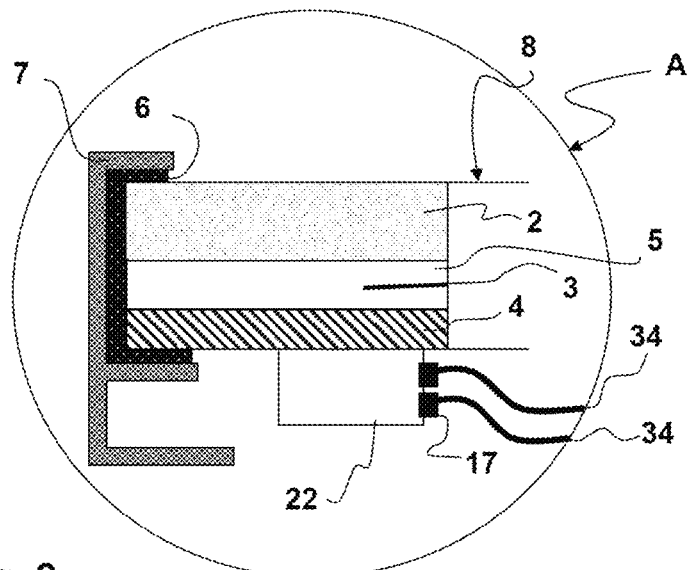
Figure 3:
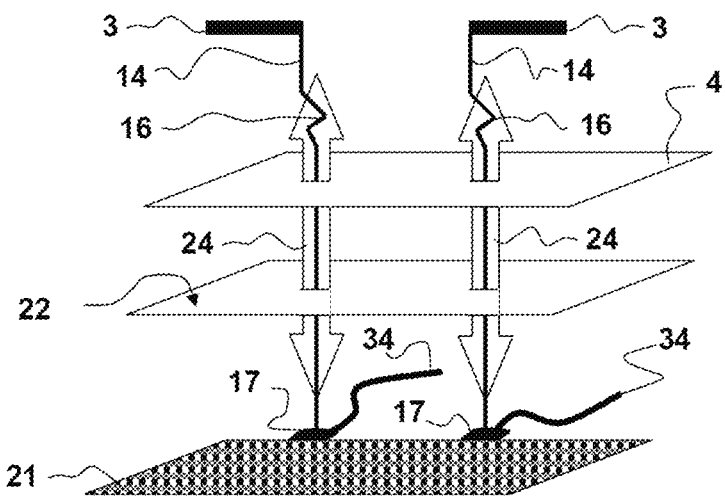
Figure 4:
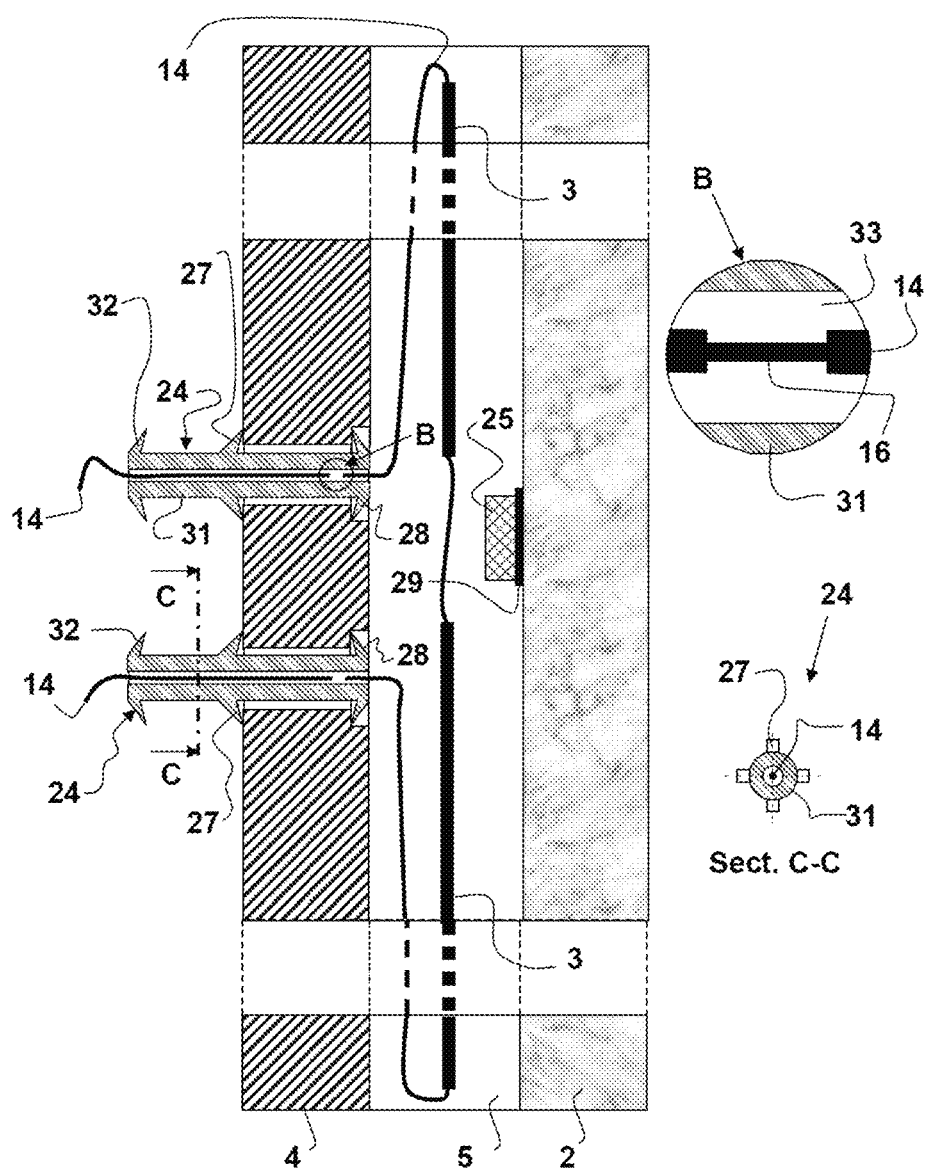
Figure 5:
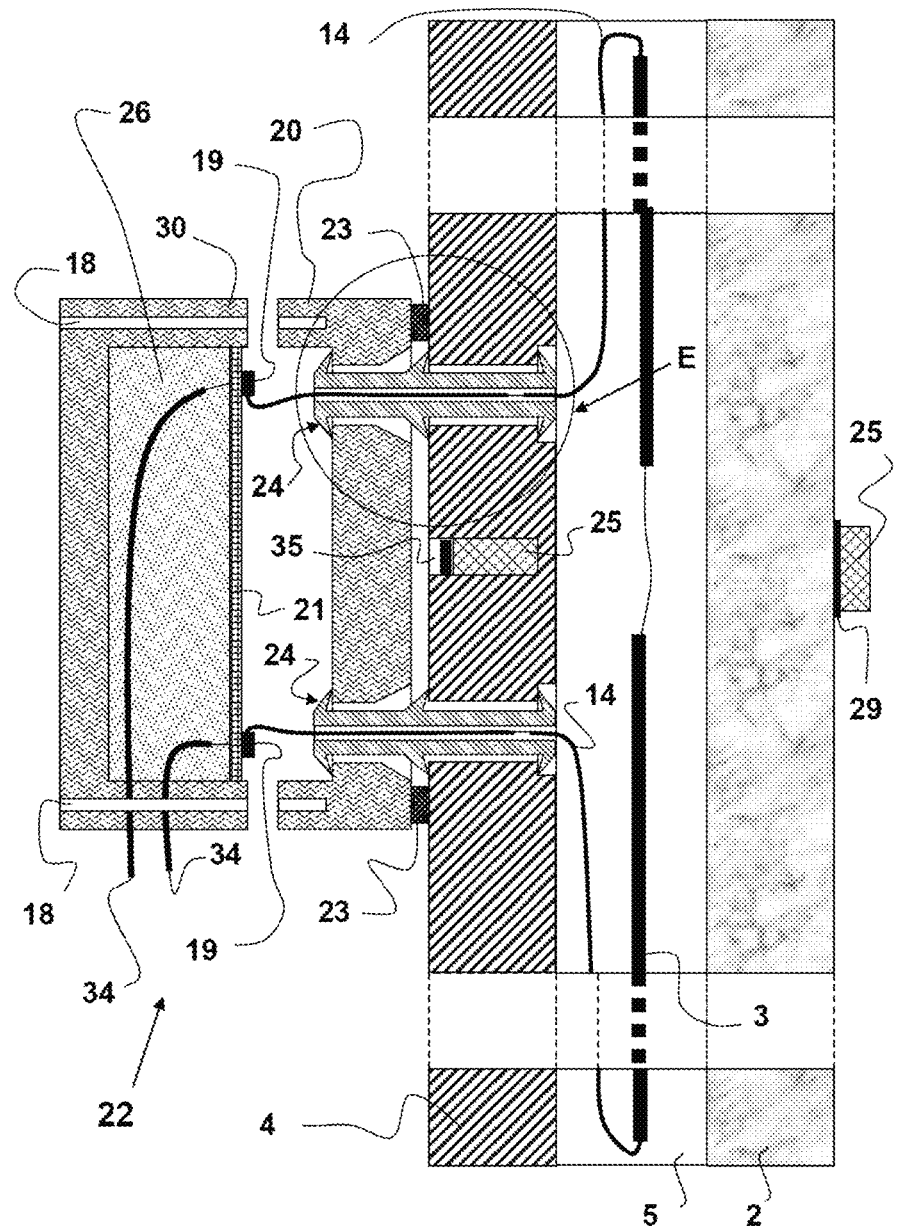
Figure 6:
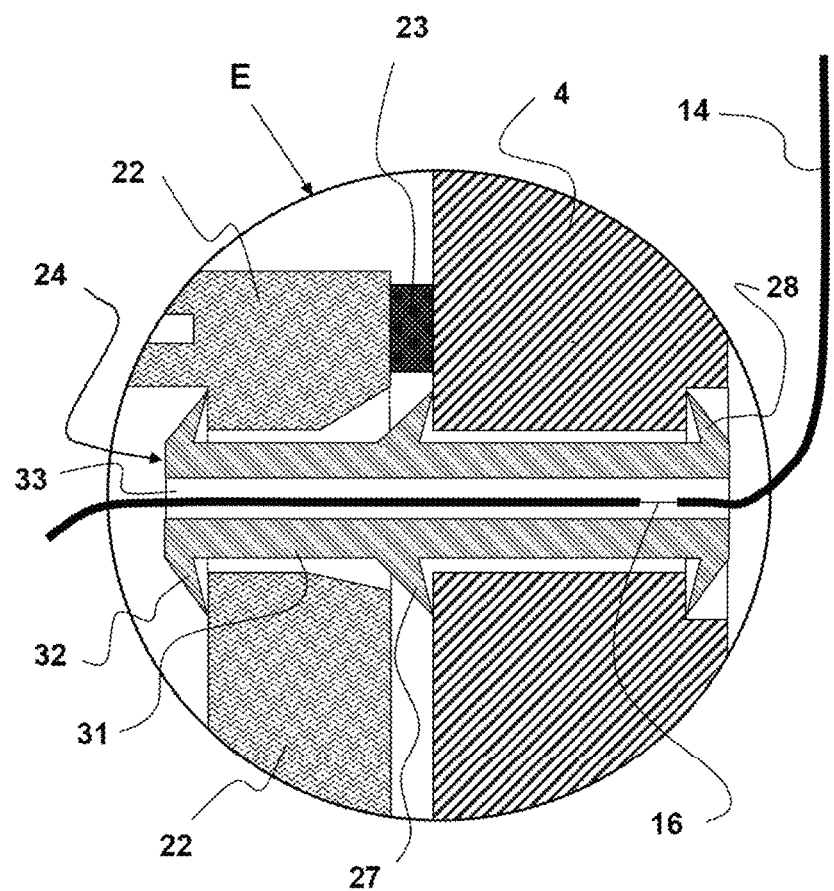

The above purposes and the consequent advantages, as well as the characteristics according to the present invention, will emerge more clearly from the ensuing description of some preferred embodiments, provided hereinafter by way of non-limiting example, in particular with reference to the attached drawings, in which:

FIG. 1 is a schematic view of a multi-cell 3 photovoltaic panel 8 of a known type, represented in cross section, to which the anti-effraction and antitheft system 1 according to the present invention has been applied at the attachment of the junction box 22; the system 1 is further provided with a georeferenced central control system 39, which can be connected, via a wired or wireless communication port, to a generic PC 40, on which a generic software enables programming, also locally by the user after prior entry of a password or else remotely after prior connection of the PC 40 to a public network, of the central system 39; in the present figure, in addition to the rays of the solar radiation 13 impinging upon the cells 3 of the panel 8, also represented are the conductive cables at output 34 from the junction box 22 for supplying a private user 11 or public user 15, via a charge regulator 9 and an inverter 10, or, alternatively, for charging a series of batteries or accumulators 12;

FIG. 2 is an enlarged schematic cross-sectional view of the detail A of said photovoltaic panel 8, present in FIG. 1, which highlights the modality of application of the anti-effraction and antitheft system 1, via connection of said junction box 22 to the rear section or Tedlar® 4 of the photovoltaic panel 8, the latter being constituted, as is known, by a first front layer of tempered glass 2, for covering the photovoltaic cell 3, immersed in the encapsulation material or EVA 5, the ensemble being supported by said Tedlar® 4, with the panel 8 usually enclosed by means of silicone sealant 6 in an aluminium frame 7; also visible in the present figure are the conductive cables at output 34 for transmission of the electrical energy obtained by conversion of solar energy by the photovoltaic cells;

FIG. 3 illustrates in a schematic way the anti-effraction idea applied to the photovoltaic panel on which the present anti-effraction and antitheft system 1 is based, namely, a synergistic and mutual connection that is rigidly unremovable except by effraction, provided between the junction box 22 and the rear layer of Tedlar® 4 of the photovoltaic panel, via a pair of electromechanical anti-effraction means 24, which are designed to anchor the Tedlar® 4 unremovably to the box 22, and, vice versa, the box 22 to the Tedlar® 4, where the conductive wire 14 has been rendered easy to break in the event of effraction, owing to the presence of a reduced section 16, within the means 24 itself;

FIG. 4 shows a cross-sectional schematic representation of a preferred, but non-limiting, embodiment of what is represented schematically in FIG. 3, namely, a pair of electromechanical anti-effraction means 24, which are unremovably anchored to the Tedlar® 4 via an anchoring grip 27-28; highlighted on the right in said FIG. 4 are the sections C-C and D-D in order to bring out the modalities of construction of the electromechanical anti-effraction means 24, as highlighted likewise is the detail "B" in order to point out more clearly the reduced section 16 of the conductive cables 14 for connection of the photovoltaic cells 3 to the PBA 21 present in the junction box 22 (not shown in this figure);

FIG. 5 shows the same cross-sectional schematic representation of the preferred, but non-limiting, embodiment illustrated in FIG. 4, now complete owing to the presence of the junction box 22, which is in the present figure rigidly constrained by said electromechanical anti-effraction means 24, via a plurality of grips 32 that are anchored in the inner surface of the junction box 22;

FIG. 6 is the detail E of FIG. 5 enlarged in order to bring out more clearly the peculiarities of the preferred, but non-limiting, solution of a possible embodiment of the electromechanical anti-effraction means 24.

With reference to the attached figures, it emerges how the anti-effraction and antitheft system 1 for photovoltaic panels 8 according to the present invention enables, precisely on account of its characteristics linked to the impossibility of the re-use of the photovoltaic panels 8 constrained to said system 1, a valid and effective deterrent against any attempt at theft.

As compared to the known art, in fact, the present anti-effraction and antitheft system 1 for photovoltaic panels 8 introduces a fundamental novelty, namely that of performing the antitheft function with at least a triple combination of protections of a passive type (both of a mechanical type and of an electronic type), i.e., ones intrinsic to the system 1, which differ from the protections of an active type in so far as the latter necessarily require human intervention, usually being characterized by the alarm function.

The three passive functions integrated in the system 1 are the following:

an interruption of the mechanical integrity of the function of electrical connection of the panel 8, constituted by the individual photovoltaic cells 3, to the junction box 22, with consequent loss of correct use of the individual photovoltaic module 3 in so far as breaking of the two pairs of metal connectors 14, which occurs in the attempts at effraction upon disconnection of the panel 8 from the junction box 22, causes the impossibility of connecting the photovoltaic panel 8 to a new system without the possibility of hiding the fact that effraction has occurred;

an interruption of the flow of current of the photovoltaic panel 8, as well as of any other function, by the PBA electronic management device 21 of the panel when the effraction is based upon removal of the panel 8 and of the junction box 22 uniquely associated thereto, following upon the loss of communication due to removal from the central system 39;

an interruption of the flow of current of the photovoltaic panel 8, as well as of every other function, by the card 21 for management of the photovoltaic panel 8, when the attempt at theft is based upon the simultaneous removal of the photovoltaic panels 8 with junction boxes 22 together with the central system 39, which in this case it would realize that it is no longer present in the range of action envisaged, including possible tolerances, ceasing to send acknowledgement to the management cards 21.

All three functions have a permanent effect over time and consequently, thanks to their combined effect, characterize the anti-effraction and antitheft system 1 as a markedly effective deterrent.

The inventive idea prevalently lies in the fact that an electromechanical anti-effraction means 24 has been designed, such as the one shown in FIGS. 4, 5 and 6, which has the purpose of inhibiting the attempt at theft of said photovoltaic panels 8, precisely on account of the modalities with which the anti-effraction constraint between the junction box 22 and the photovoltaic panel 8 is provided.

The junction box 22 is, in fact, rigidly constrained by means of said pair of electromechanical anti-effraction means 24 to be inserted, by irreversible coupling, into the Tedlar® 4 set in the rear part of the photovoltaic panel 8 before the junction box 22 is installed, as emerges from FIGS. 4 and 5. The electro-mechanical anti-effraction means 24, in this way, can be coupled, in a way that is irreversible and unremovable, except via effraction, both to the rear protective layer 4 of the panel 8, of a Tedlar® type or the like, and to the junction box 22.

The electro-mechanical anti-effraction means 24 is basically constituted by a cylindrical body 31, which is made of dielectric material and is axially hollow.

The cylindrical body 31 is externally provided with a plurality of coupling grips 27-28-32, of which at least one first pair 27 is fixed on the outer surface of the Tedlar® 4, a second pair 28 on the inner surface of the Tedlar® 4, and a third pair 31 on the inner surface of the junction box 22.

In the cavity 33 of said electro-mechanical anti-effraction means 24 a conductive cable 14 can be inserted, which is directly connected to the photovoltaic cell 3 of the panel 8 and is provided, in a position corresponding to a generic section inside the duct represented by said cavity 33, with at least one restricted section 16 in order to facilitate, in the event of effraction, also breaking of the conductive cable 14, said latter element constituting, however, an optional deterrent.

The lid 30 closes the base 20 of the junction box by insertion of screws in the threaded holes 18 present both in the lid 30 and in the base 20 of the junction box 22.

The PBA 21 is instead rigidly constrained to the lid 30 of the box by insertion of resin 26 and is further constrained to the lid itself by fixing with screws 19, through which the flow of the current takes place by means of said conductive cables 14, which possibly can be tapered also in the stretch set between the PBA 21 and the lid 30, within the area filled with resin 26.

A gasket 23 guarantees IP-65 degree of tightness and electrical protection, or similar degree, of the junction box 22 in contact with the photovoltaic panel 8.

To enable a good deterrent to be obtained also in regard to the current practice of re-use of stolen panels 8, after having detached, leaving it on the site of the crime, the junction box 22, thus accepting the fact of leaving a visible trace of breaking of the connector 24 in the proximity of the panel 8, and using a junction box purchased new, with the present system 1 the PBA 21 and, hence, the junction box 22, can be rendered usable via programming, upon their initial installation, in exclusive combination with a single photovoltaic panel 8, for example by communication to the central system 39, via PC 40 and corresponding specific software, locally or remotely, of the serial number of the panel, which will be verified in real time through a data base. When the panel itself 8 is inexistent or stolen or has already been used, the central system 39 will not send the acknowledgement signal to the PBA 21, and consequently the latter will no longer render the panel 8 functional. In this way, the effect of dissuasion from effraction of the individual photovoltaic panel 8 and of the electrical plant or system in general to which said PBA 21 will be applied will be enhanced.

The function of programming with possibility of activation or reactivation of the functions of the card 21 is likewise usable to enable restoration, at any moment, of operation of the system 1 in the cases where removal of the central system 39 from its position of installation, or removal of the central system 39 from the card 21 or vice versa, take place for reasons of maintenance or in any case for other logistic reasons not correlated to attempts at theft or effraction.

The possibility of programming the cards 21 is on the other hand fundamental also in the case where it is desired to use another arrangement that is valid in terms of deterrence (as an alternative to the modular system constituted by the application of the connectors 24 between the panel 8 and the junction box 22, after prior suitable perforation of the rear protective layer 4, of a Tedlar® type or the like), constituted by the application of a passive proximity transponder or tag or RFID 25 on the outer surface of the panel 8 beforehand on the layer of glass or the like, in a position corresponding to the junction box, set on the rear side of the panel 8. In this case, the junction box 22 may continue to be engaged and constrained to the panel 8 as currently occurs, i.e., via application of adhesive-sealant generally of a silicone nature or equivalent. In fact, in this case the management card is equipped with electronic read circuits for reading the tag 25, which are available in the state of the art in association with the tags 25 themselves, which periodically will communicate with the tag 25 itself, and, in the case where the serial number of the tag 25 is not the one for which the PBA 21 has been programmed or in the case where the signal of response from the tag 25 does not arrive, the flow of current from the panel 8 will be interrupted by the circuits of the PBA 21. The tag 25 can be installed both during the production cycle of the panel 8 (as shown in the example of FIG. 4) and at the site of installation (as shown in the two alternative applications both represented by way of example in FIG. 5). In all cases, a novelty with respect to the state of the art is represented by the fact that the tag 25 itself will be applied, in an area of boundary between one photovoltaic cell 3 and another, so as not to obstruct the solar radiation incident on the panel 8, through the use of fast-hardening resins 29 made of material such as not to enable removal thereof from the top layer of the panel without at least partial breakage of the top glass of the panel, thus causing unusability of the panel itself or at least the presence of a permanent trace indicating effraction. On the other hand, the action of removal could easily lead the tag 25 to interrupt its communication with the management card 21, with immediate consequent interruption of operation of the panel.

The PBA 21, by means of the solution just described, can thus applied "off-line", i.e., in a way independent of the production process for making the panel 8, namely, on the panel 8, via said electromechanical anti-effraction means 24, that can be likened to a connector.

The connectors 24 can be installed on the photovoltaic panels 8 either on-line, i.e., in the framework of the production cycle of the panel 8 itself, or off-line. In either case, they can be produced even by firms that are not manufacturers of panels 8, and hence this does not involve for the latter any undesirable upheaval of their production cycles given that insertion of said tags 25 (as shown in FIG. 5) will previously involve only provision of an appropriate hole 35 in the rear protective layer 4 of the panel 8, made of Tedlar® or other similar materials.

The PBA 21 may likewise be provided with a centralized function of collection of data on performance and diagnostics from each panel 8, in a way similar to what is described in the patent No. US20080147335, for centralized and remote monitoring of programmed maintenance of the panel 8 and for efficient management thereof.

The PBA 21 can communicate the occurrence of possible effraction events to the central system 39 so as to alert both in situ, via acoustic alarm, and remotely, in the case where it is connected to the PC 40, by generation of an e-mail, phone call, sms, etc., the PC 40 or the central system 39 being equipped with a modem.

The PBA 21 can be likewise provided with electronics that performs the MPPT function.

As emerges, the advantages deriving from the present invention consist above all in having devised an antitheft system for photovoltaic panels that manages to offer three distinct forms of protection that are well-integrated in order to render ineffective any attempt at theft, in so far as:

1) any such attempt will leave trace of the removal of the panel since the connectors both on the panel side and on the junction-box side remain broken and hence force the thief to carry out manual operations of welding in the case where he were to wish to re-use the photovoltaic panel by connecting again the two electrical cables necessary for operation of the panel, and at the same time prevent any possibility of masking the illicit origin of the panels;

2) in addition, with an automatic electronic procedure, which can be implemented either with wired logic and with firmware logic, via self-disabling of the functions of the junction box, the junction-box becomes a smart junction box on account of the electronic card integrated therewith and its capacity for interrupting the supply of energy by the panel when the loss of communications with the central system occurs (preferably via radio and possibly in a wired way or with any other suitable form of signalling, such as, for example, the capacity of the management card to perceive disconnection of the cables downstream of the junction-box itself);

3) finally, with an automatic electronic procedure, that can be implemented either with wired logic or with firmware logic, via the capacity of the central system, which renders possible disabling, via appropriate communication, of the functionality of the junction box, given that the latter is a smart junction box on account of the electronic PBA card integrated therewith, with the further capacity of interrupting the supply of energy by the panel following upon the receipt of specific and encoded communication (preferably via radio, but also in a wired way) by the central system when it perceives, thanks to its georeferencing capacity, that the panel has been removed from its original position following upon an attempt at theft.

In an optional version of the present invention, the functionality referred to in the previous point, i.e., the deterrents in regard to removal of the panel from the junction box 22, can be provided by replacing the specific connectors 24 with a tag or RFID 25 applied on the front face of the panel (as emerges in one of the two applications exemplified in FIG. 5) via a gluing means or resin 29 and by providing engagement of the junction box 22 to the panel 8 via simple deposition of a sealant layer on the edges (as an alternative to, and in place of, said gasket 23) and providing the management card 21 with an RFID-reading unit 25, which of course communicates with the wired or firmware-based logic of the management card 21 itself.

Said antitheft functions, the second one and the third one of which can be combined to functions of generation of an alarm by the central system, which is in turn connected via the Internet to a server capable of handling the generation of alarms and the record of a plurality of photovoltaic plants or systems, are, on the other hand, permanent in time in order to achieve a markedly deterrent antitheft effect.

It is hence evident that, in the current state of the art, there does not exist a solution with combined functions integrated in a logic of an antitheft system, such as the one described in the present invention.

It is also evident that numerous modifications, adaptations, integrations, and variations may be made to the example of embodiment of the system described herein by way of illustrative and non-limiting example, as well as replacements of elements with other functionally equivalent ones, without thereby departing from the sphere of protection of the ensuing claims.

The invention claimed is:

1. An antitheft/anti-effraction system (1) for a photovoltaic panel (8), comprising:
    at least one electromechanical means (24) insertable via an irreversible coupling system (27, 28) in a rear layer (4) of the photovoltaic panel (8), and connecting both mechanically and electrically the panel (8) to a junction box (22) via electrical cable (14) and irreversible coupling means (32);
    an electronic unit (21) for management of the panel (8) that is insertable into the junction box (22) and fixed with respect thereto, and which, via said electromechanical means (24), is rendered fixed with respect to the panel (8) and designed to interrupt a flow of current of the panel (8) through electronic devices according to bidirectional communication logics;
    a central system (39), which communicates with the electronic unit (21) for management of the panel (8) and is equipped with bidirectional communication means connected to a PC (40) equipped with software dedicated to communication and management of the panel, said PC (40) being connected to a wide area communication system;
    wherein said central system (39) is equipped with means for georeferencing, and said electromechanical means (24) is coupled, in a way that is irreversible and unremovable except by effraction, both to the rear layer (4), and to the junction box (22), in such a way that an attempt at forced separation of said junction box (22), in addition to entailing an electrical discontinuity of the electrical cable (14), involves irremediable breakage of at least one of the coupling system, the coupling means, and the panel (8);
    wherein said electro-mechanical means (24) comprises a cylindrical body (31), which is made of dielectric material and is axially hollow (33); and
    wherein said coupling system comprises plural grips externally provided on said cylindrical body (31), of which a first grip (27) is fixed on an outer surface of the rear layer (4), and a second grip (28) is fixed on an inner surface of the rear layer (4), and wherein said coupling means includes a third grip fixed on an inner surface of the junction box (22).

2. The antitheft/anti-effraction system (1) according to claim 1, wherein said electronic unit (21) is arranged to render unusable energy supplied by the panel (8) when a position of the junction box (22), with respect to which the panel (8) is fixed, changes with respect to the central system (39), or when said electronic unit (21) no longer communicates with the central system (39), wherein the panel (8) is arrange to communicate periodically with the junction box (22), or with the electronic unit (21), up to a pre-set distance with respect to the central system (39).

3. The antitheft/anti-effraction system (1) according to claim 1, wherein the central system (39), is arranged so that when the central system is removed beyond a pre-set distance from the pane (8), the central system sends automatically an alarm signal to the management (unit) (21), and so that after a pre-set time interval of absence of communication with said management unit, the central system interrupts communication with the management unit, thus entering a functional condition of failure of operation of the panel.

4. The antitheft/anti-effraction system (1) according to claim 1, wherein the electrical cable (14) has a portion inside the axial hollow of the electro-mechanical means (24) with a restricted section (16) for facilitating breaking of the electrical cable (14) upon effraction of the junction box (22) or of the panel (8).

5. The antitheft/anti-effraction system (1) according to claim 1, wherein the electrical unit (21) is provided with a circuit for prompting and reading tags or RFID devices and the panel (8) is provided, on its surface in the proximity of the junction box (22), with a passive proximity transponder or tag or RFID (25) communicating with said electrical unit (21), and is also designed to receive/transmit signals from/to the remote central system (39) via an integrated receiver in such a way that, in the absence of response of the transponder/tag/RFID (25) to the encoded signal sent by the electrical unit (21), said electrical unit (21) interrupts the flow of current in the panel (8).

6. The antitheft/anti-effraction system (1) according to claim 5, wherein said junction box (22) is positioned relative to the transponder/tag/RFID (25) on the panel (8) to enable a frequent, periodic or non-periodic, check during querying by said electronic unit (21), in order to detect effective presence of the transponder/tag/RFID (25) in its vicinity.

7. The antitheft/anti-effraction system (1) according to claim 1, wherein the electronic unit (21) is programmable via communication with the central system (39), enabling in this case use of the junction box (22) in exclusive combination with a single said panel (8), the latter functioning only via correct decoding of its identification code by the electronic unit (21).

8. The antitheft and/or anti-effraction system (1) according to claim 1, wherein the electronic unit (21) is arranged to issue an alert signal either locally, via acoustic alarm, or remotely, by generation of a message.

9. The antitheft/anti-effraction system (1) according to claim 1, wherein the electronic unit (21) is provided with electronic circuitry for optimization of transfer of power by the panel.

* * * * *